United States Patent
Chen et al.

(10) Patent No.: US 9,807,517 B2
(45) Date of Patent: Oct. 31, 2017

(54) MEMS MICROPHONE

(71) Applicants: Hu Chen, Shenzhen (CN); Kai Wang, Shenzhen (CN)

(72) Inventors: Hu Chen, Shenzhen (CN); Kai Wang, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/006,407

(22) Filed: Jan. 26, 2016

(65) Prior Publication Data

US 2016/0381466 A1 Dec. 29, 2016

(30) Foreign Application Priority Data

Jun. 24, 2015 (CN) .................. 2015 2 0439559 U

(51) Int. Cl.
*H04R 19/04* (2006.01)
*B81B 7/02* (2006.01)
*H04R 19/00* (2006.01)

(52) U.S. Cl.
CPC ............ *H04R 19/04* (2013.01); *B81B 7/02* (2013.01); *B81B 2201/0257* (2013.01); *B81B 2203/0315* (2013.01); *B81B 2207/015* (2013.01); *B81B 2207/07* (2013.01); *H04R 19/005* (2013.01); *H04R 2201/003* (2013.01)

(58) Field of Classification Search
CPC ........ H04R 1/04; H04R 19/04; H04R 19/005; H04R 2201/003; H04R 2499/11; B81B 7/02; B81B 2201/0257; B81B 2203/0315; B81B 2207/015; B81B 2207/07
See application file for complete search history.

(56) References Cited

U.S. PATENT DOCUMENTS

| | | | |
|---|---|---|---|
| 6,433,412 B2 * | 8/2002 | Ando | H01L 21/563 257/676 |
| 7,233,674 B2 * | 6/2007 | Song | H04R 31/006 381/113 |
| 2003/0035558 A1 * | 2/2003 | Kawamura | H04R 19/005 381/113 |
| 2004/0202345 A1 * | 10/2004 | Stenberg | H04R 19/04 381/369 |
| 2007/0025570 A1 * | 2/2007 | Yonehara | H04R 19/04 381/174 |
| 2008/0025532 A1 * | 1/2008 | Yonehara | H04R 19/016 381/174 |
| 2008/0044043 A1 * | 2/2008 | Yonehara | H04R 19/04 381/174 |

(Continued)

*Primary Examiner* — Joshua Kaufman
(74) *Attorney, Agent, or Firm* — Na Xu; IPro, PLLC

(57) ABSTRACT

The MEMS microphone includes a first circuit board; a second circuit board keeping a distance from the first circuit board; a frame located between the first circuit board and the second circuit board for forming a cavity cooperatively with the first circuit board and the second circuit board, the frame including a plated-through-hole; an ASIC chip located in the cavity; and an MEMS chip having a back cavity. The first circuit board is electrically connected with the second circuit board by the plated-through-hole. The frame includes a conductive layer and an insulating layer, and the conductive layer is located between an inner surface of the frame and the insulating layer.

7 Claims, 1 Drawing Sheet

(56) References Cited

U.S. PATENT DOCUMENTS

| | | | |
|---|---|---|---|
| 2008/0075309 A1* | 3/2008 | Chen | B81B 7/0061 381/175 |
| 2008/0122020 A1* | 5/2008 | Metz | B81C 1/00301 257/415 |
| 2008/0130920 A1* | 6/2008 | Yonehara | H01G 5/014 381/174 |
| 2009/0001553 A1* | 1/2009 | Pahl | B81B 7/0064 257/704 |
| 2009/0154734 A1* | 6/2009 | Jeong | H04R 19/005 381/173 |
| 2010/0108345 A1* | 5/2010 | Hsu | B81B 7/0061 174/50 |
| 2010/0246877 A1* | 9/2010 | Wang | H04R 19/005 381/361 |
| 2010/0284553 A1* | 11/2010 | Conti | B81B 7/0061 381/174 |
| 2011/0121416 A1* | 5/2011 | Quevy | B81B 7/02 257/417 |
| 2011/0222717 A1* | 9/2011 | Kuratani | H04R 19/005 381/355 |
| 2011/0274299 A1* | 11/2011 | Shaw | B81B 7/0064 381/174 |
| 2011/0293126 A1* | 12/2011 | Maekawa | H04R 19/005 381/355 |
| 2012/0243721 A1* | 9/2012 | Inoda | H04R 3/005 381/365 |
| 2012/0275634 A1* | 11/2012 | Leidl | H04R 19/005 381/369 |
| 2012/0321111 A1* | 12/2012 | Lillelund | H04R 1/04 381/174 |
| 2013/0032936 A1* | 2/2013 | Formosa | H04R 31/00 257/704 |
| 2016/0219377 A1* | 7/2016 | Chi | H04R 19/04 |
| 2016/0381466 A1* | 12/2016 | Chen | H04R 19/04 381/365 |

* cited by examiner

MEMS MICROPHONE

FIELD OF THE INVENTION

The present disclosure relates to microphones, more particularly to a MEMS microphone.

DESCRIPTION OF RELATED ART

With the development of wireless communication technology, there are more and more mobile phone users in the world. The mobile phone users are no longer satisfied by the calling function of mobile phone, but require high quality call results. Especially in current development of mobile multimedia technology, mobile phone call quality is more important. The microphone of mobile phone is a voice pickup device in the mobile phone and its design will have a direct effect on call quality.

The microphone with more popularity and better performance at present is MEMS (Micro-Electro-Mechanical-Systems) microphone. A typical MEMS microphone includes a housing, a circuit board engaging with the housing to form a cavity, a MEMS chip and an ASIC chip received in the cavity. A sound access hole and a soldering pad are both installed on the housing or the circuit board. When the product is designed, the sound access mode is too simple. The smart devices at present are provided generally with various of sound access modes, so these sound access modes can be matched for removing noise and sound directing.

Therefore, it is necessary to provide a novel MEMS microphone to solve the problems above.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENT

The present invention will hereinafter be described in detail with reference to an exemplary embodiment. To make the technical problems to be solved, technical solutions and beneficial effects of present disclosure more apparent, the present disclosure is described in further detail together with the figures and the embodiment. It should be understood the specific embodiment described hereby is only to explain this disclosure, not intended to limit this disclosure.

Figure 1:
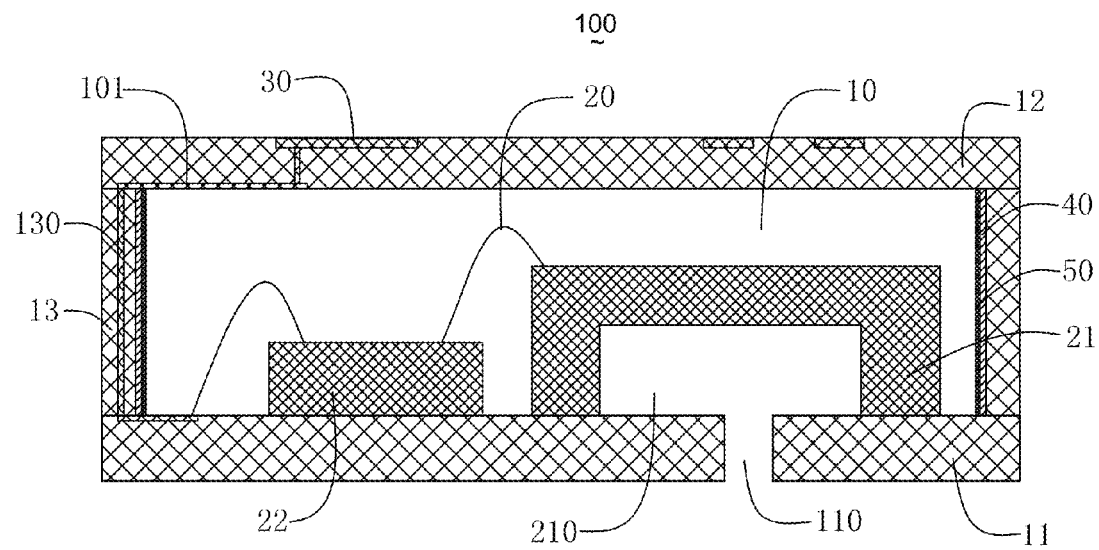
FIG. 1 is cross-sectional view of a MEMS microphone in accordance with an exemplary embodiment of the present disclosure.
Figure 2:
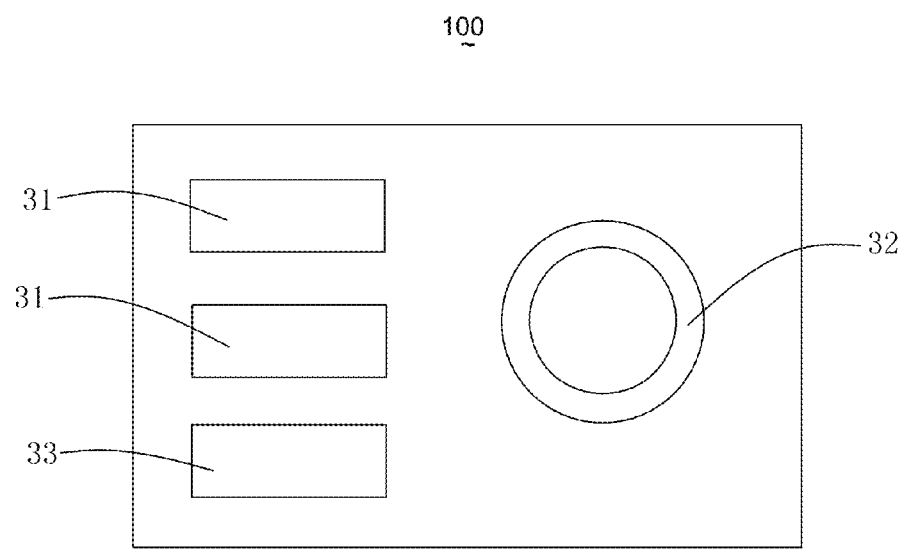
FIG. 2 is a top view of the MEMS microphone in FIG. 1.

As shown in FIG. 1, a MEMS microphone in accordance with an exemplary embodiment of the present disclosure includes a first circuit board 11, a second circuit board 12 keeping a distance from the first circuit board 11, a frame 13 located between the first circuit board 11 and the second circuit board 12 and forming a cavity 10 cooperatively with the first circuit board 11 and the second circuit board 12, an ASIC (Application Specific Integrated Circuits) chip 22 located in the cavity 10, and a MEMS chip 21 provided with a back cavity 210.

The first circuit board 11 is provided with a sound access hole 110. The second circuit board 12 is provided with a soldering pad 30 for connecting external electric circuit, which makes the sound access hole 110 and the soldering pad 30 locate at different surfaces, and realizes different acoustic functions of the product, and thereby increases the performance of the product. The soldering pad 30 includes a first soldering pad 31 as a differential signal output terminal, a second soldering pad 32 for differential signal output terminal as well as a third soldering pad 33 connected to power supply. This structure by means of differential signal processing improves the signal-to-noise ratio of the microphone.

In addition, the MEMS chip 21 and the ASIC chip 22 are located on the first circuit board 11. The back cavity 210 of MEMS chip 21 is communicated with the sound access hole 110. Alternatively, the MEMS chip and the ASIC chip can also be placed on the second circuit board, or either MEMS chip or ASIC chip is located on the first circuit board, and another is placed on the second circuit board. The MEMS chip 21 and the ASIC chip 22 are electrically connected to each other by a gold wire 20, and connected to the circuit board by a binding gold wire 20.

The frame 13 is provided with a plated-through-hole 130. The first circuit board 11 is connected electrically with the second circuit board 12 by the plated-through-hole 130. Specifically, the first circuit board 11 and the second circuit board 12 are provided with a conductive path 101. The binding gold wire 20 is connected electrically with the conductive path 101, and connected electrically with the conductive path 101 on the second circuit board 12 by the plated-through hole 130. The conductive path 101 on the second circuit board 12 is connected electrically with the soldering pad 30, so that the MEMS chip 21 and the ASIC chip 22 can be connected electrically to external circuit.

In this embodiment, an inner surface of the frame 13 is provided with a conductive layer 40 and an insulating layer 50. The conductive layer 40 is located between the inner surface and the insulating layer 50 of the frame 13. The conductive layer 40 can not only connect electrically the first circuit board 11 and the second circuit board 12, but also shield overall the product and improve the product's ability against RF interference. The insulating layer 50 is made of insulating material coated on the inner surface of the frame to prevent solder reflow. The insulating material is coated evenly on the inner surface of the frame in electrophoresis process. The internal short-circuit of MEMS microphone can be prevented, and the soldering tin or other impurities can be prevented also from entering the product inside during reflow soldering.

It is to be understood, however, that even though numerous characteristics and advantages of the present embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A MEMS microphone, comprising:
   a first circuit board with planar structure;
   a second circuit board with planar structure keeping a distance from the first circuit board;

a frame located between the first circuit board and the second circuit board for forming a cavity cooperatively with the first circuit board and the second circuit board, the frame including a plated-through-hole;

an ASIC chip located in the cavity; and an MEMS chip having a back cavity;

wherein the plated-through-hole runs through the whole frame, the first circuit board is electrically connected with the second circuit board by the plated-through-hole, the frame includes a conductive layer and an insulating layer, the conductive layer is located between an inner surface of the frame and the insulating layer, and the inner surface is faced to the cavity.

2. The MEMS microphone as described in claim 1, wherein the first circuit board includes a sound access hole.

3. The MEMS microphone as described in claim 2, wherein the MEMS chip is located on the first circuit board, and the back cavity of the MEMS chip is connected with the sound access hole.

4. The MEMS microphone as described in claim 1, wherein the second circuit board is provided with a soldering pad for connecting external electric circuit.

5. The MEMS microphone as described in claim 4, wherein the soldering pad includes a first soldering pad as differential signal output terminal, and a second soldering pad for differential signal output terminal, and a third soldering pad connected for connecting with power supply.

6. The MEMS microphone as described in claim 4, wherein the first circuit board and the second circuit board are provided with a conductive path, via which the ASIC chip is connected with the soldering pad electrically.

7. The MEMS microphone as described in claim 6 further including a binding gold wire for electrically connecting the ASIC chip and the MEMS chip, the binding gold wire is connected electrically with the conductive path.

* * * * *